United States Patent [19]

Noguchi et al.

[11] Patent Number: 4,481,464
[45] Date of Patent: Nov. 6, 1984

[54] APPARATUS FOR MEASURING TIME VARIANT DEVICE IMPEDANCE

[75] Inventors: Hitoshi Noguchi; Tomoyuki Akiyama; Hideo Akama; Hideo Okara, Japan; Hisao Yoshino, all of Tokyo, Japan

[73] Assignee: Hewlett-Packard Company, Palo Alto, Calif.

[21] Appl. No.: 435,437

[22] Filed: Oct. 20, 1982

[30] Foreign Application Priority Data

Oct. 30, 1981 [JP] Japan .................................. 56-173854

[51] Int. Cl.³ .............................................. G01R 27/00
[52] U.S. Cl. ................................ 324/57 PS; 324/57 R
[58] Field of Search ............... 324/57 R, 57 PS, 57 H, 324/60 R

[56] References Cited
PUBLICATIONS

Maeda: "An Automatic Precision 1 MHZ Digital LCR Meter"—hp Journal Mar. 74, pp. 2–9.
Hashimoto: "An Automatic Wide Range Digital LCR Meter" hp Journal Sep. 76, pp. 9–15.

Primary Examiner—Stanley T. Krawczewicz
Assistant Examiner—Jose M. Solis
Attorney, Agent, or Firm—Jeffery B. Fromm

[57] ABSTRACT

An apparatus is disclosed which can accurately measure time variant non-ideal device impedance without unwanted delays caused by internal filters. A novel scheme is used which reduces both noise and drift so that the measurement of time variant capacitance and conductance can be made with increased precision for accurately determining such semiconductor characteristics as carrier lifetime and trap level.

6 Claims, 20 Drawing Figures

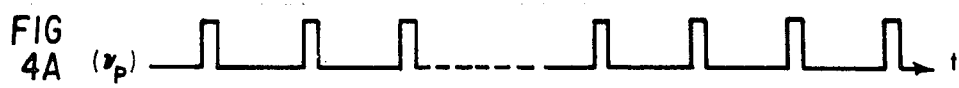
FIG 4A ($v_P$)
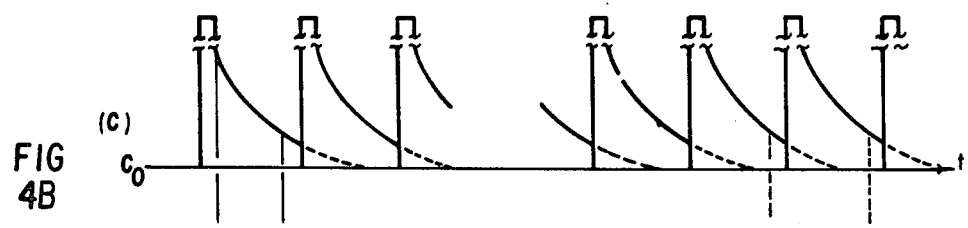
FIG 4B (C) $c_0$
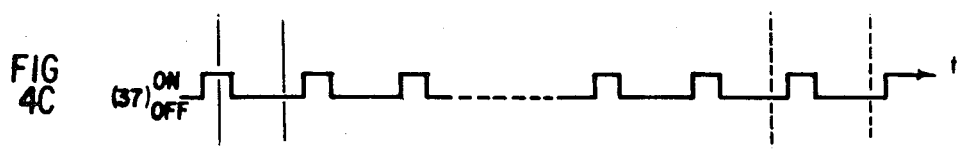
FIG 4C (37) ON/OFF
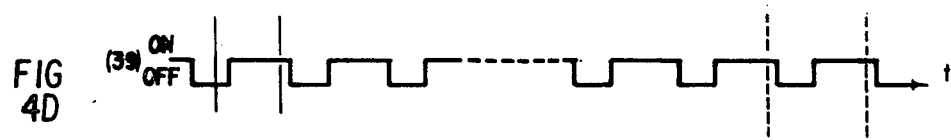
FIG 4D (39) ON/OFF
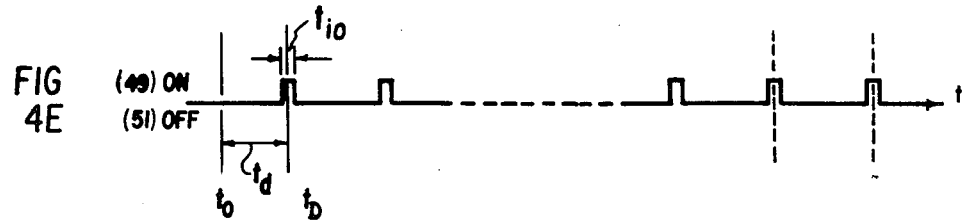
FIG 4E (49) ON (51) OFF
$t_{i0}$, $t_0$, $t_d$, $t_D$
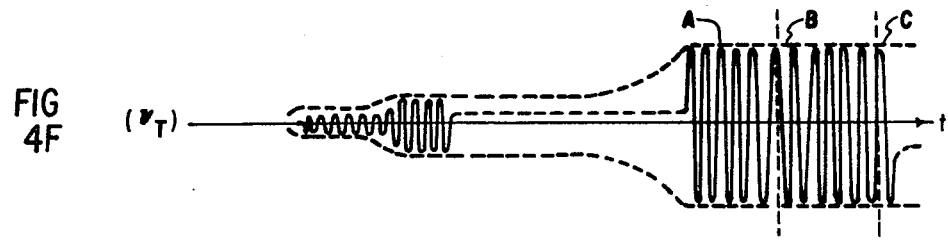
FIG 4F ($v_T$)
A, B, C
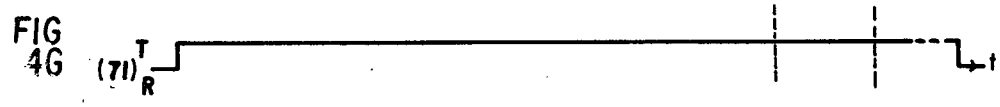
FIG 4G (71) T/R
FIG 4H (87) ON/OFF
D, E

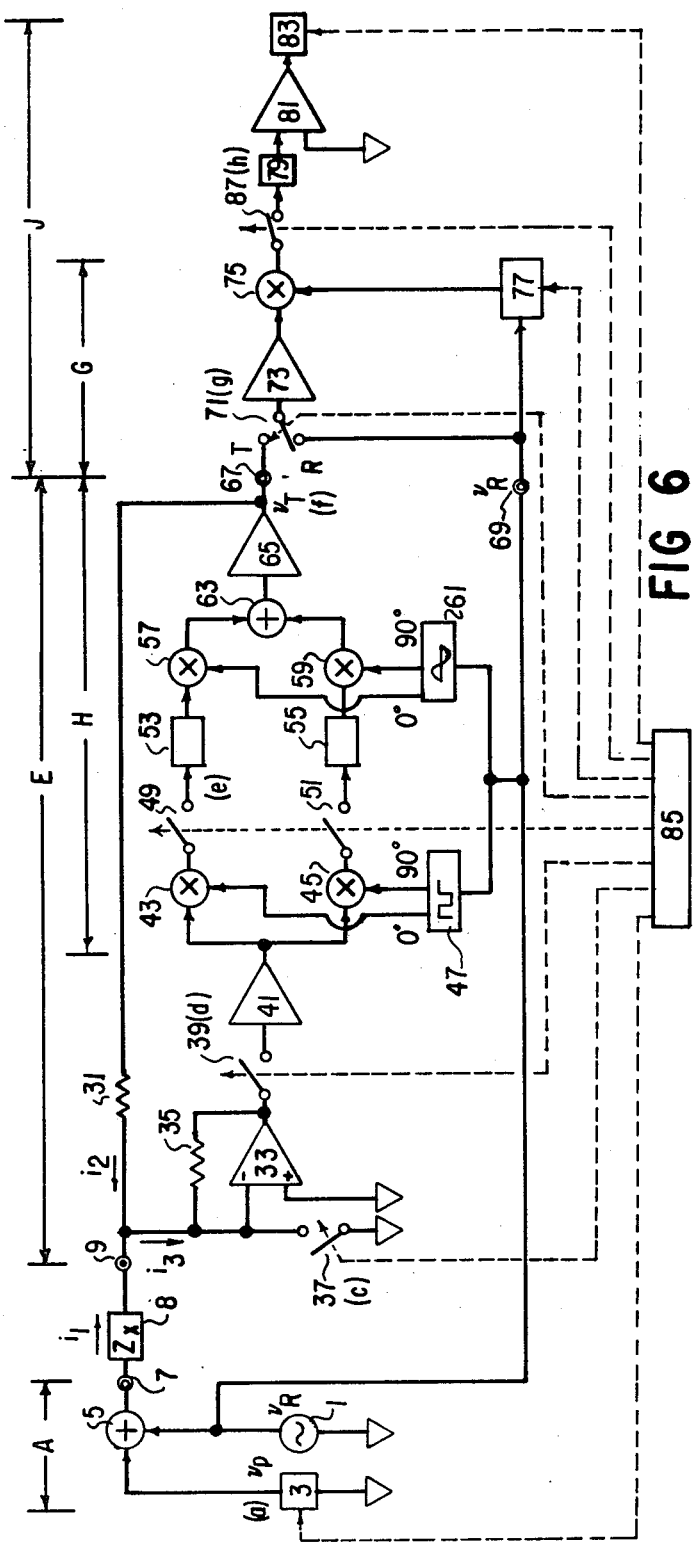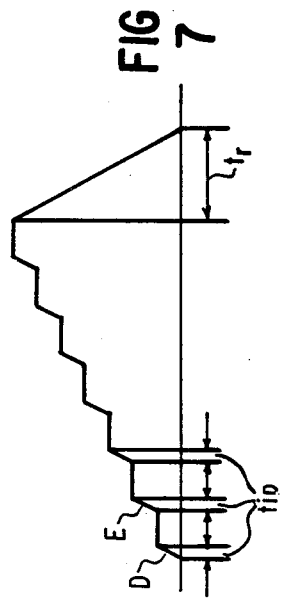
FIG 7
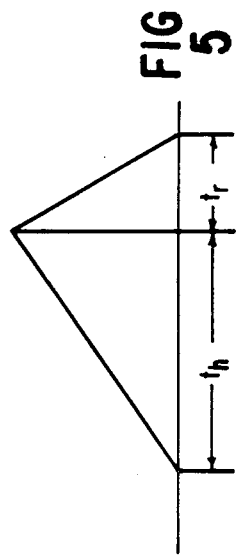
FIG 5

1

APPARATUS FOR MEASURING TIME VARIANT DEVICE IMPEDANCE

BACKGROUND OF THE INVENTION

The electrical parameters of ideal devices, such as theoretical capacitors and resistors are invariant with respect to the impressed voltage or the current passing through the devices and the length of time these voltages or currents are applied. Unfortunately, many devices do not behave in an ideal manner. For one such class of device for example, the equivalent capacitance C or conductance G will vary in time when a pulse of voltage or current is applied.

An apparatus to measure these time variant parameters, C-t and G-t, is often used for determining the characteristics of semiconductors such as diodes so as to calculate carrier lifetimes, trap levels, and the like.

Apparatuses for performing the C-t and G-t measurement are known in the prior art, however, in the past it has not been possible to accurately make these measurements. There are several sources of this measurement inaccuracy. First, a filter has been employed in the circuitry which causes internal time delays so that the admittance value ($j\omega C+G$) is actually measured after the passage of a given period from the point of occurrence of the actual change in admittance. Second, the accuracy of the circuits used for converting the current proportional to the admittance value to a voltage has been too low to insure low measurement error. Finally, in the prior art the analog to digital converters (A/D) used for converting an analog voltage corresponding to the admittance value to a digital value has been affected by the actual amplitude of the measuring signal. Thus, a change in the measuring level causes additional measurement error.

SUMMARY OF THE INVENTION

The present invention discloses an apparatus for measuring the time varying impedance of non-ideal devices when a pulse or similar signal is applied to the device.

In accordance with a first embodiment of the present invention, the present apparatus comprises an input portion for adding a pulse signal to a sine wave measuring signal and applying the resulting combined signal to an element to be measured; a current to voltage conversion circuit including a sampling integration type modulation amplifier, for accurately converting a current flowing through the element to be measured caused by the sum signal to a voltage; an AC to DC conversion circuit for selectively introducing the output signal of the current to voltage conversion circuit or the combined measuring signal and converting the selected signal into a DC signal through phase-detection; and an integration type vector voltage ratio measuring circuit for converting the resultant analog signal of the above-mentioned conversion to a digital signal and measuring the vector voltage ratio of the two signals.

In accordance with a second embodiment of the present invention, a sampling integration type vector voltage ratio measuring circuit is employed in place of the integration type vector voltage ratio measuring circuit mentioned above so as to conduct the measurement with a higher degree of accuracy.

The result is an apparatus which can measure time variant non-ideal device impedance without the delays caused by filtering used in the prior art. In addition, the measuring signal is converted into a digital output with reduced error due to noise or drift in the measuring circuitry.

BRIEF DESCRIPTION OF THE DRAWINGS

FIGS. 4A through 4H are diagrams useful for explaining the operation of the apparatus shown in FIG. 3.

FIG. 5 is a diagram useful for explaining the operation of the vector voltage ratio measuring circuit shown in FIG. 3.

FIG. 6 is a block diagram of the apparatus for measuring device parameters in accordance with a second embodiment of the present invention.

FIG. 7 is a diagram useful for explaining the operation of the sampling integration vector voltage ration measuring circuit shown in FIG. 6.

DETAILED DESCRIPTION OF THE INVENTION

To simplify the explanation of the invention, a description of the prior art apparatus will be discussed.

Figure 1:
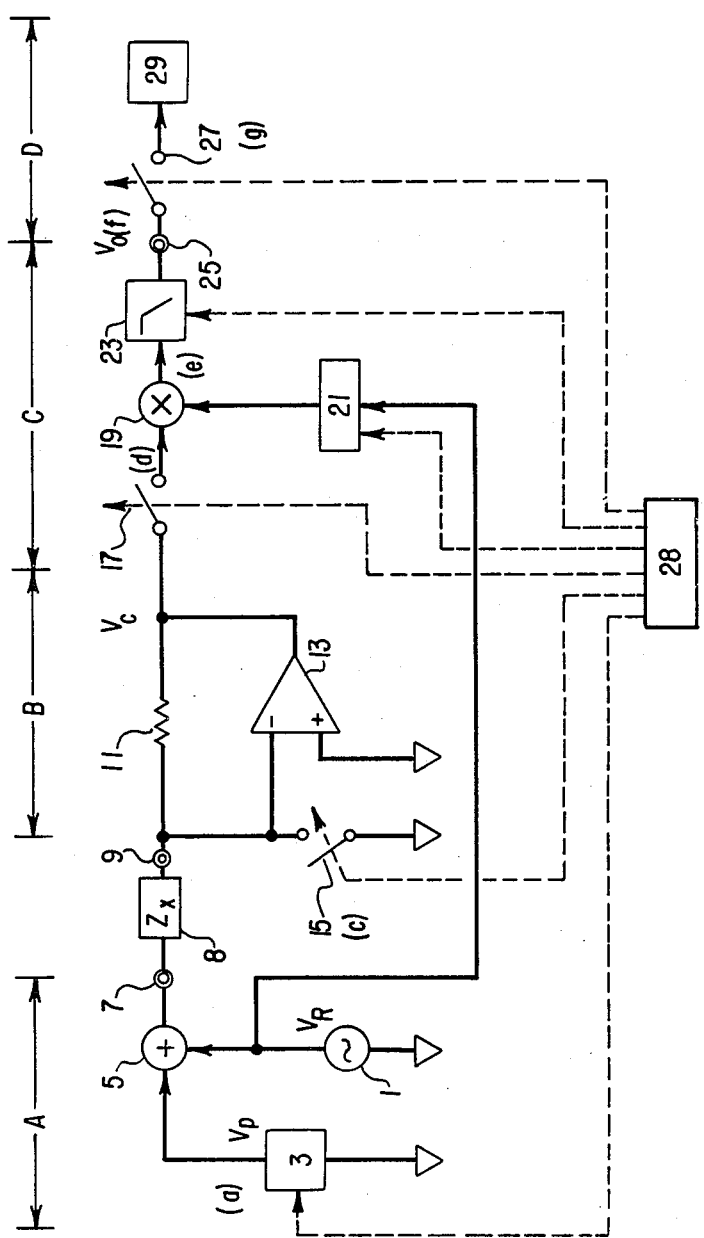
FIG. 1 is a block diagram of a conventional capacitance measuring apparatus.

FIG. 1 shows a block diagram of the conventional capacitance measurement apparatus which measures the capacitance value after the passage of a given period of time from the occurrence of a change in the capacitance of an element to be measured, by applying a pulse signal $V_P$ and a measuring signal $V_R$ to the element to be measured. The conventional apparatus consists of an input portion A, a current to voltage conversion portion B, an AC to DC conversion circuit C and an A/D conversion portion D. In the input portion A, a measuring signal sine wave $V_R$ from a measuring signal source 1 and a pulse signal $V_P$ from a pulse generator 3 are added by an adder 5 and the sum signal of adder 5 is applied to one of the terminals 7 to which the element 8 ($Z_X$) to be measured is connected. The current to voltage conversion circuit B is composed of an operational amplifier 13 with high gain and high input impedance, with its inverting input terminal connected to the second terminal 9 of the element to be measured and a feedback resistor 11 ($R_{11}$) interposed between the inverting input and output terminals of amplifier 13. A switch 15 is connected between the inverting input terminal of the amplifier 13 and the circuit ground terminal and switch 15 is closed during the application of the pulse signal $V_P$ to bypass the pulse current.

Accordingly, a voltage $V_C$ which is approximately proportional to the admittance of the element 8 is generated at the output terminal of the amplifier 13. Thus $V_C$ is proportional to $Z_X*V_i=(j\omega C+G)*V_i$. The AC to DC conversion circuit C consists of: a phase detector 19 having a first input terminal for receiving the output signal of the amplifier 13 through a switch 17 and a second input terminal for receiving the output signal of a phase shifter 21; and a filter 23 for smoothing and eliminating noise from the output signal of the phase detector 19. The switch 17 is kept open during the application of the pulse $V_P$. The phase shifter 21 receives the output signal $V_R$ of the measuring signal source 1 and generates a signal having the same phase or a phase shifted by 90 degrees relative to $V_R$. The time constant of the filter 23 must be changed in accordance with the speed of the phenomenon to be measured, for example the changing rate of the capacitance. Accordingly, a DC signal representative of the capacitance value or the losses in the element 8 is generated at the output terminal 25 of the filter 23.

The A/D conversion portion D consists of a switch 27 for selectively sampling the signals at the terminal 25 and an A/D conversion circuit 29. The switch 27 is closed for a certain period of time after the change in the capacitance caused by the application of the pulse signal $V_P$ to permit sampling the signals at the terminal 25. The A/D conversion circuit 29 converts the sampled DC voltage to a digital value and calculates the capacitance value C.

A control circuit 28 controls the pulse generating operation of the pulse generator 3, the opening and closing operations of the switches 15, 17 and 27, the phase shifting operation of the phase shifter 21, and the selection of the time constant of the filer 23.

Figure 2A:
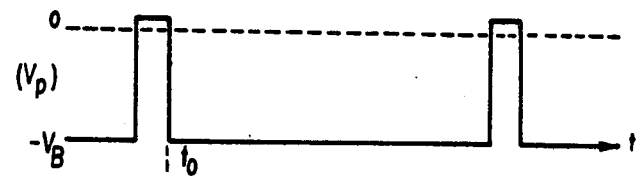
FIGS. 2A through 2G are diagrams useful for explaining the operation of the apparatus shown in FIG. 1.
Figure 2B:
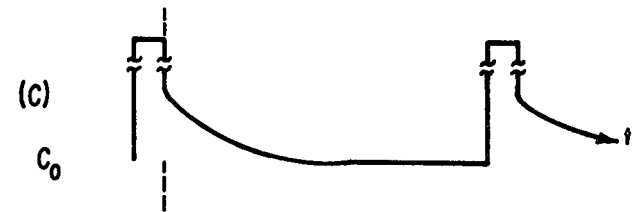
Figure 2C:
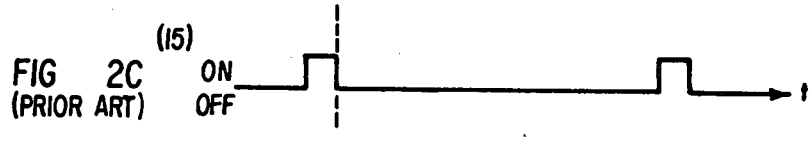
Figure 2D:

FIGS. 2A through 2G are diagrams useful for explaining the operation of the conventional apparatus shown in FIG. 1. In the drawing, FIG. 2A shows the output signal $V_P$ of the pulse generator 3. When the output signal $V_P$ is applied to the element 8, such as a diode, the capacitance value C varies exponentially with a steady value $C_o$ as the reference, as ilustrated in FIG. 2B. The switch 15 is kept closed only during the application of the pulse as shown in FIG. 2C for by-passing the changing current due to the pulse $V_P$. On the other hand, the switch 17 is closed after completion of the pulse $V_P$ and is kept closed, for example, until the capacitance C settles to the steady value $C_o$. Therefore, after the end of the pulse $V_P$ only the measuring signal $V_R$ is applied to the element 8 and a voltage $V_c$ approximately proportional to the admittance of the element 8 occurs at the output of the amplifier 31.

Figure 2E:
Figure 2F:
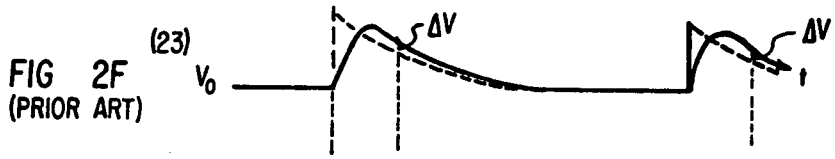
Figure 2G:
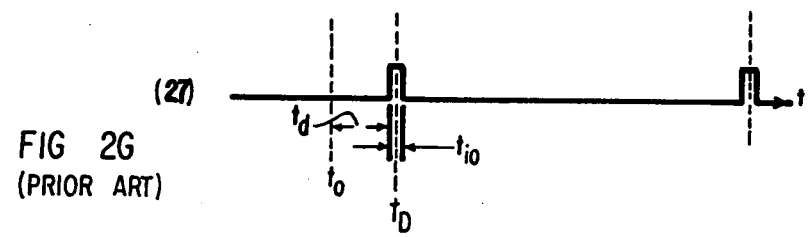

To measure the capacitance value of the element 8, the phase shifter 21 shifts the phase of the input signal by 90 degrees relative to $V_R$. Then, a signal having a magnitude proportional to the capacitance value occurs at the output of the phase detector 19 as shown in FIG. 2E. Accordingly, a voltage $V_o$ represented by the solid line in FIG. 2F, that is, a signal delayed by the time constant of the filter 23 as represented by the dotted line in FIG. 2F, occurs at the output 25 of the filter 23. Though the time constant of filter 23 is changed in accordance with the rate of change of the capacitance value shown in FIG. 2B, a certain amount of delay cannot be avoided causing a voltage error $\Delta V$ as shown in FIG. 2F. The switch 27 is kept closed for a predetermined period $t_n$ with the time $t_D$ delayed by a time $t_d$ from the time $t_o$ of the trailing edge of the pulse $V_P$. The time $t_D$ is the center of the period for sampling the output analog signal $V_o$. The sampled value is then converted to a digital signal by the A/D conversion circuit 29 to obtain and display the capacitance value, the losses or the like.

However, the conventional apparatus just described has the following undesirable characteristics.

(1) Since the current to voltage conversion circuit B is fundamentally composed of only the operational amplifier 13, the current in the element 8 will not exactly be equal to the current in the feedback resistor 11.

(2) Since the filter 23 is used, a time delay shown in FIG. 2F occurs, generating the error $\Delta V$. Hence, the actual device characteristics at the time $t_D$ cannot be measured.

(3) The time constant of the filter 23 must be changed in accordance with the time characteristics of the element to be measured.

(4) The A/D conversion portion D detects only the output analog signal of the filter 23. Therefore, any drift of the measuring signal $V_R$ causes additional measurement error.

Figure 3:
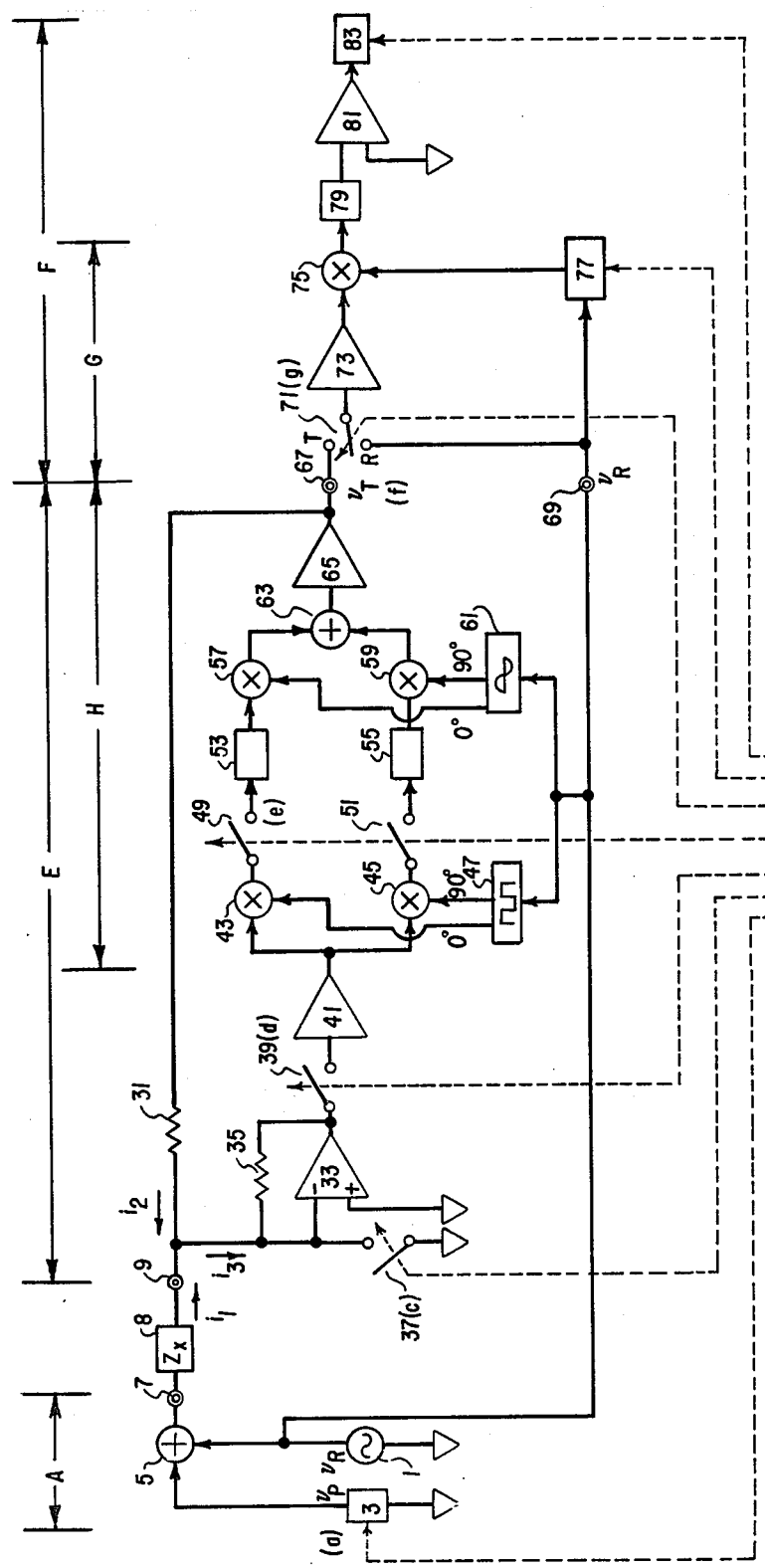
FIG. 3 is a block diagram of the apparatus for measuring device parameters in accordance with one embodiment of the present invention.

FIG. 3 is a block diagram of the apparatus for measuring capacitance or other impedance parameters in accordance with one embodiment of the present invention. The apparatus consists of the input portion A, the current to voltage conversion circuit E including a sampling integration type modulation amplifier H, and an integration type (dual slope) vector voltage ratio measuring circuit F including an AC to DC conversion circuit G that selectively introduces and phase detects the signal to be measured $V_P$ or the reference signal $V_R$ for determining the vector voltage ratio between a measured signal $V_T$ and $V_R$.

The input portion A is the same in FIG. 1 and applies the sum signal of a reference signal $V_R$, such as a 1 MHz sine wave, and measurement signal $V_P$ such as a pulse signal, to the element 8 via a first terminal 7. The current to voltage conversion circuit E forces the current $i_1$ flowing through the element 8 and the current $i_2$ flowing through the feedback resistor 31 to be equal. The signal occurring at a second terminal 9 to which the element 8 is connected is applied to the sampling integration modulation amplifier H through amplifier 33, switch 39 and amplifier 41. The inverting input terminal of amplifier 33 is connected to terminal 9 and is also connected to the ground terminal via the switch 37.

The sampling integration type modulation amplifier H includes several subsections: a first series circuit consisting of a first phase detector 43, a switch 49, a first integrator 53 and a first modulator 57; a second series circuit consisting of a second phase detector 45, a switch 51, a second integrator 55 and a second modulator 59; interconnections for applying the output signal of the amplifier 41 to the first and second series circuits; an adder 63 for adding the output signals of the first and second series circuits to each other; an interconnection for applying the adder signal 63 to the inverting input terminal of the amplifier 33 through the amplifier 65 and the feedback resistor 31; and first and second phase shifters 47 and 61 for applying a signal having the same phase as that of the reference signal $V_R$ and a signal whose phase is shifted by 90 degrees relative to $V_R$ to the first and second phase detectors 43 and 45 and to the first and second modulators 57 and 59, respectively.

Accordingly, the AC output signal of the amplifier 41 is first converted to DC by the first and second phase detectors 43 and 45. The DC signals are then converted back to AC signals by the first and second modulators 57 and 59, summed by adder 36 and fed back to the amplifier 33 through amplifier 64 and feedback resistor 31.

The AC to DC conversion circuit G consists of: a switch 71 which selects either the output signal $V_T$ of the current to voltage conversion circuit E or the reference signal $V_R$ and applies the selected voltage to one of the input terminals of the phase detector 75 through the amplifier 73; and a phase shifter 77 which applies a signal having the same phase as that of the reference signal $V_R$ or a signal with its phase shifted by 90 degrees or 180 degrees with respect to the reference signal $V_R$ to another input terminal of the phase detector 75. Along with the AC to DC conversion in circuit G, the integration type vector voltage ratio measuring circuit F consists of an integration circuit 79 for integrating the output current signal of the phase detector 75, and a comparator 81 and a digital logic circuit 83 connected to the output of the integration circuit 79. A control circuit 85 controls the application of pulses by pulse generator 3, the opening and closing of switches 37, 39, 49, 51 and 71, the phase shift operation of the phase shifter 77, and the timing of the digitization by the logic circuit 83.

FIGS. 4A through 4H are timing diagrams useful for explaining the operation of the apparatus shown in FIG. 3. It will be assumed that the element 8 is a diode and that when the pulse signal $V_P$ is applied as shown in FIG. 4A, the capacitance value C of the diode 8 changes exponentially from the steady value $C_o$ as shown in FIG. 4B. The switch 37 as shown in FIG. 4C is closed only during the period of the pulse $V_P$ and causes the current $i_1$ flowing through the element 8 to flow to the ground terminal, thus disabling the operation of the current to voltage conversion circuit E during the pulse $V_P$. After completion of the pulse $V_P$, the switch 39 as shown in FIG. 4D is closed until the next pulse $V_P$ is applied thus enabling the current to voltage conversion circuit E. In this example, the current produced by the reference signal $V_R$ flows through the diode 8 and the magnitude of this current is proportional to the admittance (j $\omega$C+G) of the diode 8. The current to voltage conversion circuit E operates so that the amplifier error current $i_3$ having the same frequency as the reference signal $V_R$ and flowing into the amplifier 33 becomes zero. That is, the current $i_1$ becomes equal to the current $i_2$ flowing through the feedback resistor 31. In the unbalanced state ($i_3 \neq 0$), the current 13 is converted to a voltage by the amplifier 33, is then amplified by the amplifier 41 and is applied to the sampling integration modulation amplifier H.

The first series circuit detects the component of the error signal $i_3$ having the same phase as the reference signal $V_R$ with the first phase detector 43, then holds this in-phase component with the integrator 53 which then converts it into an AC signal with the first modulator 57. Similarly, the second series circuit detects the component of the error signal $i_3$ with its phase shifted by 90 degrees with respect to the reference signal $V_R$ with the second phase detector 45, holds this out-of-phase component with the integrator 55 and converts it into an AC signal with the second modulator 59. The outputs of the two AC modulators 57 and 59, representing the magnitude of the error signals, are then added by the addition circuit 63, amplified by the amplifier 65, and are fed back through the feed back resistor 31.

As shown in FIG. 4E, the switches 49 and 51 are closed for a predetermined period of time $t_{i0}$, for example, 2 microseconds, with the time $t_D$ as the center, and being delayed by a selected delay time $t_d$ from the trailing edge time $t_o$ of the pulse $V_P$. Thus, the output signals of the first and second phase detectors 43 and 45 are sampled by the switches 49 and 51 and are applied to the first and second integrators 53 and 55. After the passage of a selected period of time from the sampling of the signals by the switches 49 and 51, the next pulse $V_P$ is applied. Hence, the output signal $V_T$ of the amplifier 65 reaches a constant amplitude equilibrium state at point A as shown in FIG. 4F after sampling is effected a sufficient number of times, for example, after 1 to 2 ms. Since the gain of the current to voltage conversion circuit E is extremely high, the error $i_3$ becomes zero and $$i_1 = i_2 = (j\omega C + G)V_R \qquad (1)$$

Hence, $$V_T = i_2 * R_{31} = i_1 * R_{31} = (j\omega C + G)V_R * R_{31} \qquad (2)$$

This differs from the apparatus shown in FIG. 1, in that in the present invention $V_T$ becomes an AC sine wave signal having a constant amplitude.

In the initial state as shown in FIG. 4G, switch 71 is turned to the T side for selecting the signal $V_T$ and this signal $V_T$ is applied to a first input terminal of the phase detector 75. A signal with its phase shifted 90 degrees relative to that of the reference signal $V_R$ is applied to the second input terminal of the phase detector 75 by the phase shifter 77. Accordingly, the 90 degree phase shifted component $V_{Ta}$ of the signal $V_T$ is sampled and applied to the dual slope type integration circuit 79. The integration circuit 79, whose output is shown in FIG. 5 charges for a predetermined period of time $T_h$ which is a multiple of the period of the reference signal $V_R$. After the passage of the predetermined period of time, the switch 71 is turned to the R side. The phase shifter 77 is controlled so as to deliver the same phase signal as the reference signal $V_R$. The signal $V_R$ is then present at the output of the phase detector 79, so that integration circuit 79 discharges. The comparator 81 detects when the output voltage of the integration circuit 79 becomes zero and the logic circuit 83 calculates the discharge period $t_r$.

Hence, $$V_{Ta} * t_h = j\omega C * V_R * R_{31} * t_h = V_R * t_r \qquad (3)$$

Therefore, $$j\omega C = (1/R_{31})*(t_r/t_h). \qquad (4)$$

Accordingly, the capacitance value C can be determined if $t_r$ is measured and the capacitance value C can be displayed via the logic circuit 83. Since only the vector ratio between $V_T$ and $V_R$ is used to determined the capacitance, the magnitude of the measuring signal $V_R$ itself does not affect the measured value.

To measure the losses in conductance G, the same phase signal as that of the signal $V_R$ is applied to the second input terminal of the phase detector 75 for the phase discrimination, followed by the charging operation.

If the measurement is carried out without applying the pulse signal $V_P$ but applying only the measuring signal $V_R$, the switch 37 is constantly kept open and the switches 39, 49 and 51 are constantly kept closed. Though the foregoing description describes the measurement of the capacitance of the element to be measured, the present invention can measure other time varying device parameters by the proper choice of the signal to be measured and the phase detection angle.

FIG. 6 is a block diagram showing the apparatus for measuring time varying device parameters in accordance with a second embodiment of the present invention. The apparatus shown in FIG. 6 differs from that shown in FIG. 3 in that a sampling integration type vector voltage ratio measuring circuit J is employed in place of the integration type vector voltage ratio measuring circuit F of FIG. 3. Thus, a switch 87 is interposed between the phase detector 75 and the integrator 79.

The sampling integration type vector voltage ratio measuring circuit J is used so that even if the output voltage $V_T$ changes due to noise or drift after the current to voltage conversion circuit E reaches equilibrium, a correct measurement can be conducted. Initially, the switch 71 is connected to the contact T. As shown in FIG. 4H, the switch 87 is kept closed for a certain period of time $T_{i0}$, such as 2 microseconds, in synchronism with, or in a phase lag with the switches 49 and 51 after the output voltage $V_T$ of the current to voltage conversion circuit E becomes substantially constant for sampling the output signal of the phase detector 75. Accordingly, the charging operation of the integration circuit 79 is conducted as shown in FIG. 7. If, for example, the number of samples in the charge period is n, $t_{i0}=2$ microseconds and $n*T_{i0}=10$ ms, then sampling should be effected 5,000 times (n=5,000). The value n is determined so that $n*t_{i0}$ becomes 10 ms. The discharging operation occurs while the switch 87 is kept closed in the same way as in FIG. 3.

Hence, $$V_{Ta}*n*t_{i0} = j\omega C*V_R*R_{31} *n*t_{i0} = V_R*t_r \quad (5)$$

Therefore, $$j\omega C = (1/R_{31})*[t_r/(n*t_{i0})]. \quad (6)$$

Thus, the capacitance value C of the element 8 can be obtained by measuring $t_r$.

As described above, even if the voltages at the points B and C as shown in FIG. 4F are perturbed due to noise or drift, the signal $V_T$ is sampled a sufficient number of times so that the error due to noise or drift is averaged out by integration.

Since the present invention does not use a filter, the device parameters at a given time after the application of the pulse $V_P$ can be measured accurately. The magnitude of the current flowing through the element to be measured $Z_X$ can be converted to a voltage with a high degree of accuracy and is independent of any change in amplitude of the measuring signal. Even if noise or ripple exist in the phase detected output signals of the AC to DC conversion circuit G, the apparatus of the invention is not adversely affected.

We claim:

1. An apparatus for measuring the impedance of an element, said apparatus comprising:
   input means for applying a measuring signal to said element;
   a current to voltage conversion means having a sampling integration type modulation amplifier for sampling a current flowing therethrough in a plurality of predetermined periods for integration and for converting the current flowing through said element into a voltage; and
   a vector voltage ratio measurement means having
     first means for selectively introducing the output signal of said current to voltage conversion circuit or said measuring signal, and
     second means for effecting an AC to DC conversion on said signals through phase detection for providing a vector ratio between said output signal of said current to voltage conversion circuit and said measuring signal.

2. An apparatus as in claim 1 wherein said input means comprises:
   a sine wave signal source;
   a pulse signal source; and
   an adder means coupled to said sine wave and pulse signal sources for summing said sine wave and pulse signal sources.

3. An apparatus for measuring the impedance of an element, said apparatus comprising:
   input means for applying a measuring signal to said element;
   a current to voltage conversion means having a sampling integration type modulation amplifier for sampling a current flowing therethrough in a plurality of predetermined periods for integration and for converting the current flowing through said element into a voltage; and
   a vector voltage ratio measurement means having
     first means for selectively introducing the output signal of said current to voltage conversion circuit or said measuring signal,
     second means for effecting an AC to DC conversion on said signals through phase detection,
     third means for sampling the DC signal output of said second means, and
     fourth means for integrating the sampled output of said third means,
   for providing a vector ratio between said output signal of said current to voltage conversion circuit and said measuring signal.

4. An apparatus as in claim 3 wherein said input means comprises:
   a sine wave signal source;
   a pulse signal source; and
   an adder means coupled to said sine wave and pulse signal sources for summing said sine wave and pulse signal sources.

5. An apparatus for measuring the impedance of an element, said apparatus comprising:
   input means for applying a measuring signal to said element, said input means having
     a sine wave signal source,
     a pulse signal source, and
     an adder means coupled to said sine wave and pulse signal sources for summing said sine wave and pulse signal sources;
   a current to voltage conversion means having a sampling integration type modulation amplifier for converting the current flowing through said element into a voltage; and
   a vector voltage ratio measurement means having
     first means for selectively introducing the output signal of said current to voltage conversion circuit or said measuring signal, and
     second means for effecting an AC to DC conversion on said signals through phase detection
   for providing a vector ratio between said output signal of said current to voltage conversion circuit and said measuring signal.

6. An apparatus for measuring the impedance of an element, said apparatus comprising:
   input means for applying a measuring signal to said element, said input means having
     a sine wave signal source,
     a pulse signal source, and
     an adder means coupled to said sine wave and pulse signal sources for summing said sine wave and pulse signal sources;

a current to voltage conversion means having a sampling integration type modulation amplifier for converting the current flowing through said element into a voltage; and a vector voltage ratio measurement means having first means for selectively introducing the output signal of said current to voltage conversion circuit or said measuring signal, second means for effecting an AC to DC conversion on said signals through phase detection, and third means for sampling the DC signal output of said second means for providing a vector ratio between said output signal of said current to voltage conversion circuit and said measuring signal.

* * * * *